(12) United States Patent
Ozawa et al.

(10) Patent No.: US 9,887,116 B2
(45) Date of Patent: Feb. 6, 2018

(54) SUBSTRATE STORING CONTAINER

(71) Applicant: MIRAIAL Co., Ltd, Tokyo (JP)

(72) Inventors: Kazunori Ozawa, Tokyo (JP); Kazuya Inoue, Tokyo (JP); Minoru Tomita, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 0 days.

(21) Appl. No.: 15/124,512

(22) PCT Filed: Mar. 26, 2014

(86) PCT No.: PCT/JP2014/058621
§ 371 (c)(1),
(2) Date: Sep. 8, 2016

(87) PCT Pub. No.: WO2015/145629
PCT Pub. Date: Oct. 1, 2015

(65) Prior Publication Data
US 2017/0025294 A1    Jan. 26, 2017

(51) Int. Cl.
*H01L 21/673*    (2006.01)

(52) U.S. Cl.
CPC .. *H01L 21/67376* (2013.01); *H01L 21/67369* (2013.01)

(58) Field of Classification Search
CPC ......... H01L 21/67376; H01L 21/67369; H01L 21/673
USPC ........ 206/711, 710, 454, 455; 220/806, 378; 277/641, 644, 651, 626, 628
See application file for complete search history.

(56) References Cited

U.S. PATENT DOCUMENTS

| | | | | |
|---|---|---|---|---|
| 6,354,601 B1* | 3/2002 | Krampotich | ...... | H01L 21/67376 206/710 |
| 7,578,407 B2* | 8/2009 | Tieben | ...... | H01L 21/67376 220/326 |
| 7,648,041 B2* | 1/2010 | Ueda | ...... | H01L 21/67126 206/710 |
| 8,292,081 B2* | 10/2012 | Sasaki | ...... | H01L 21/67376 206/710 |

(Continued)

FOREIGN PATENT DOCUMENTS

| | | |
|---|---|---|
| JP | 2007-62804 A | 3/2007 |
| JP | 2007-308161 A | 11/2007 |

(Continued)

*Primary Examiner* — Chun Cheung
(74) *Attorney, Agent, or Firm* — Muncy, Geissler, Olds & Lowe, P.C.

(57) ABSTRACT

The tip face 411 of the base portion 41 inserted into the retaining groove 321 and the groove bottom face 322 have a positional relationship of facing each other, and a bottom portion space 413 is formed between the base portion 41 inserted into the retaining groove 321 and the groove bottom face 322. A pair of side faces 412 of the base portion 41 inserted into the retaining groove 321 and the pair of groove side faces 323 have a positional relationship of facing each other, and side face spaces 324 which are in communication with an opening of the retaining groove 321 are respectively formed between the pair of side faces 412 of the base portion 41 inserted into the retaining groove and the pair of groove side faces 323, and the bottom portion space is in communication with the side face space.

4 Claims, 10 Drawing Sheets

(56) References Cited

U.S. PATENT DOCUMENTS

| | | | |
|---|---|---|---|
| 8,720,693 B2* | 5/2014 | Nagashima | H01L 21/67376 206/454 |
| 2009/0121533 A1* | 5/2009 | Kalina | B60N 2/3011 297/378.1 |
| 2009/0261533 A1 | 10/2009 | Inoue | |

FOREIGN PATENT DOCUMENTS

| | | |
|---|---|---|
| JP | 2009-170591 A | 7/2009 |
| JP | 2009-277688 A | 11/2009 |
| JP | 2010-52758 A | 3/2010 |
| JP | 2010-129765 A | 6/2010 |
| JP | 2013-105931 A | 5/2013 |

* cited by examiner

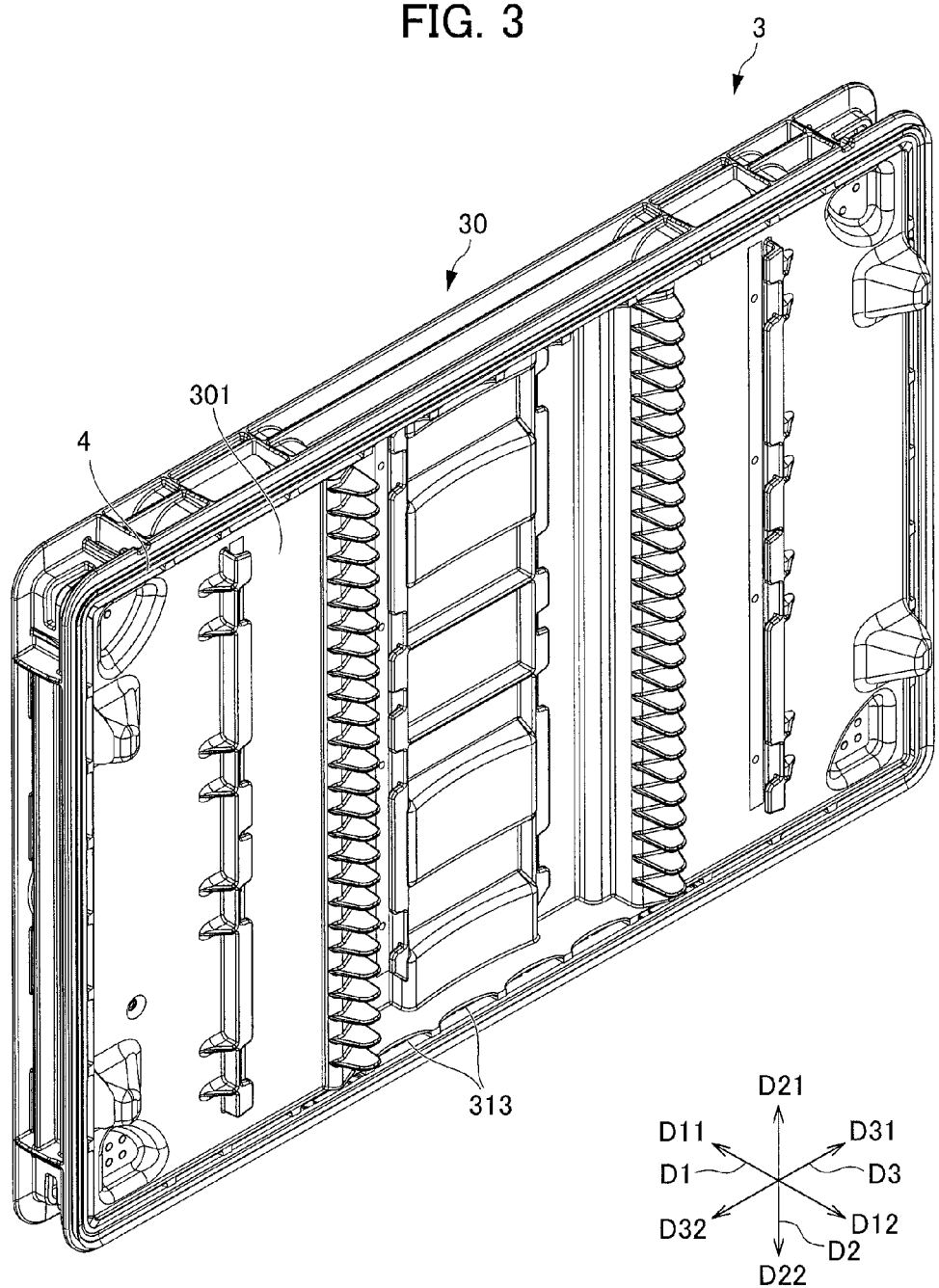

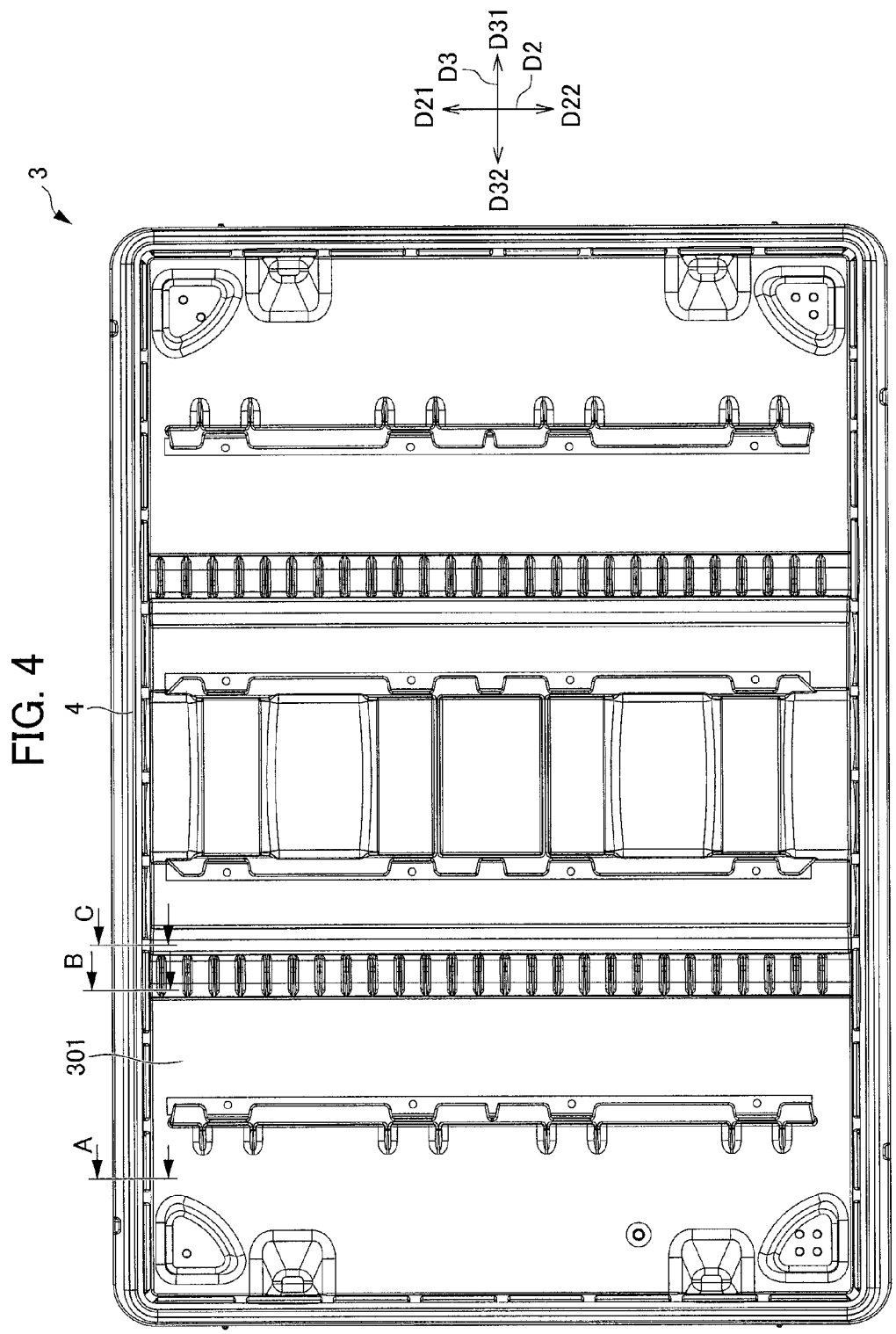

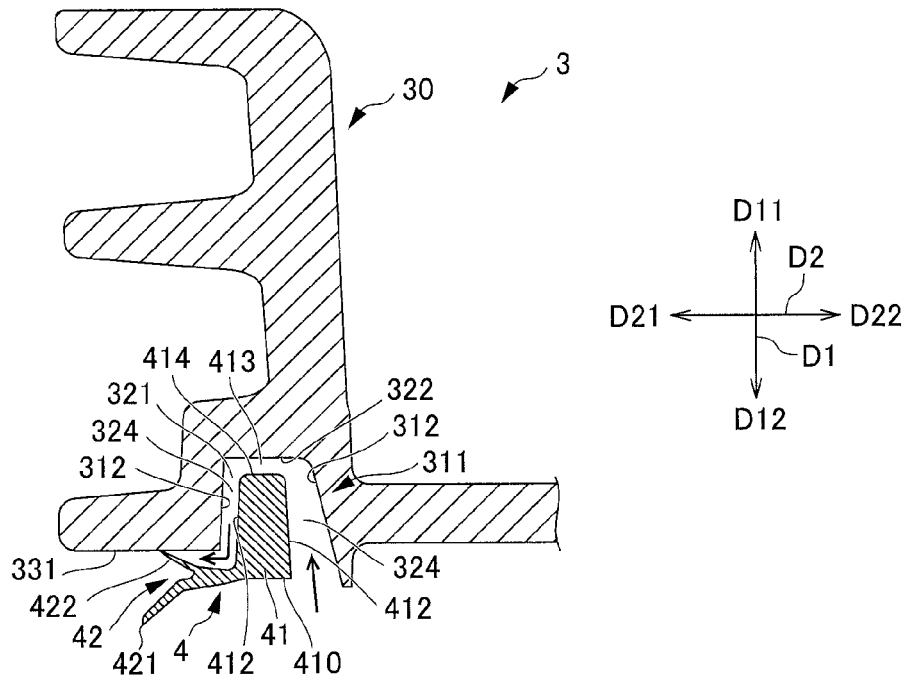
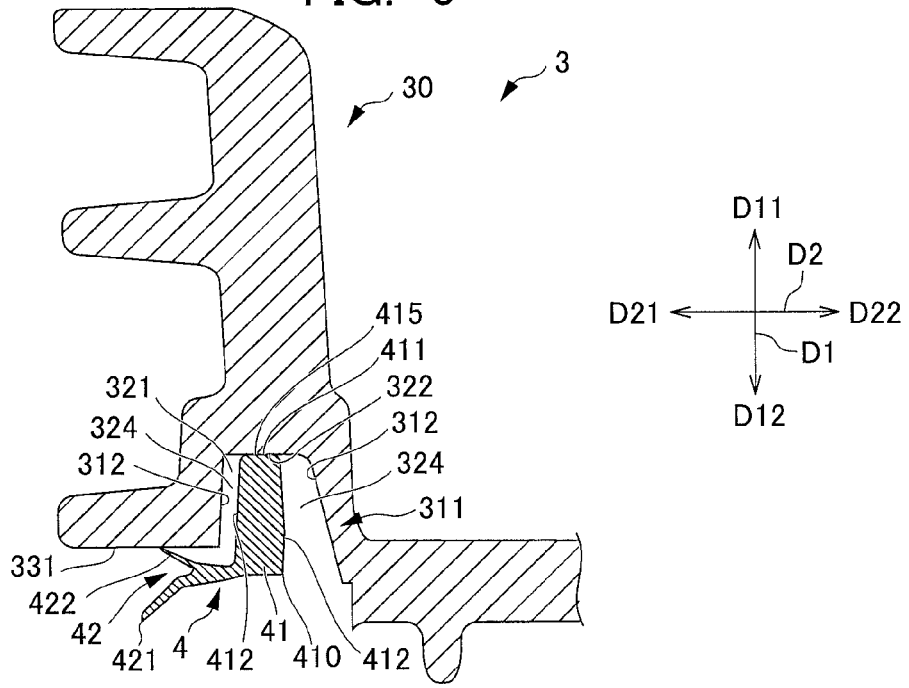

SUBSTRATE STORING CONTAINER

TECHNICAL FIELD

The present invention relates to a substrate storing container that stores substrates such as semiconductor wafers.

BACKGROUND ART

As a container that stores substrates such as semiconductor wafers, a substrate storing container has been known conventionally that has a container main body and a lid body.

The container main body has a tubular wall portion in which a container main body opening portion is formed at one end, and in which the other end is closed. A substrate storing space is formed in the container main body. The substrate storing space is formed by being surrounded by the wall portion and can store a plurality of substrates. The lid body can be removably attached to the container main body opening portion and can close the container main body opening portion.

A front retainer is provided at a part of the lid which faces a substrate storing space when the container main body opening portion is closed. When the container main body opening portion is closed by the lid body, the front retainer can support edge portions of the plurality of substrates. Furthermore, a back side substrate support portion is provided at the wall portion so as to form a pair with the front retainer. The back side substrate support portion can support edge portions of a plurality of substrates. When the container main body opening portion is closed by the lid body, the back side substrate support portion retains a plurality of substrates in a state in which adjacent substrates are arranged in parallel to be spaced apart by a predetermined interval, by supporting the plurality of substrates in cooperation with the front retainer.

In addition, a sealing member is provided to the lid body. The sealing member is inserted into a retaining groove which is formed in a sealing member attachment portion of the lid body and is arranged so as to go around an outer rim portion of the lid body. When the lid body is attached to the opening rim portion, the sealing member is elastically deformed by being held between the sealing face of the container main body and the inner face of the lid body, and the lid body closes the container main body opening portion in a sealed state. By the lid body being removed from the opening rim portion, it becomes possible to load or unload the substrates relative to the substrate storing space in the container main body (refer to Patent Documents 1 to 3).

Patent Document 1: Japanese Unexamined Patent Application, Publication No. 2013-105931

Patent Document 2: Japanese Unexamined Patent Application, Publication No. 2009-170591

Patent Document 3: Japanese Unexamined Patent Application, Publication No. 2007-308161

DISCLOSURE OF THE INVENTION

Problems to be Solved by the Invention

Projections for making it difficult for the base portion to be dislocated are provided at a portion of the base portion of the sealing member inserted into the retaining groove. For this reason, in the conventional substrate storing container as mentioned above, in the case of washing the lid body by cleaning solution with the sealing member attached to the sealing member attachment portion, the cleaning solution tends to easily flow into a space formed by the projections abutting a part of a side wall of the sealing attachment portion which forms the retaining groove. Then, it is difficult to remove the cleaning solution remaining in this space, etc., in the retaining groove by way of drying.

It is an object of the present invention to provide a substrate storing container for which cleaning solution does not easily remain in a retaining groove in a case of washing a lid body by cleaning solution with a sealing member being attached to a sealing member attachment portion.

Means for Solving the Problems

The present invention relates to a substrate storing container including: a container main body having a substrate storing space that can store a plurality of substrates formed inside thereof, and having, at one end portion thereof, an opening rim portion at which a container main body opening portion that is in communication with the substrate storing space is formed; a lid body that is removably attached to the container main body opening portion, has a sealing member attachment portion and a rim portion facing portion that faces the opening rim portion, and can close the container main body opening portion; and a sealing member that is attached to the sealing member attachment portion of the lid body, can abut the opening rim portion and the rim portion facing portion, and, by interposing between the opening rim portion and the rim portion facing portion to abut and closely contact the opening rim portion and the rim portion facing portion, closes the container main body opening portion together with the lid body in an airtight state, in which the sealing member attachment portion has a retaining groove that has a groove bottom face and a pair of groove side faces, in which the sealing member has a base portion and a lip portion, the base portion having a tip face and a pair of side faces extending from the tip face, in which the tip face and the pair of the side faces are inserted into the retaining groove, and the lip portion extending from the base portion and abutting the opening rim portion and the rim portion facing portion, in which the tip face of the base portion inserted into the retaining groove and the groove bottom face have a positional relationship of facing each other, and a bottom portion space is formed between the base portion inserted into the retaining groove and the groove bottom face, in which a pair of side faces of the base portion inserted into the retaining groove and the pair of groove side faces have a positional relationship of facing each other, and side face spaces which are in communication with an opening of the retaining groove are respectively formed between the pair of side faces of the base portion inserted into the retaining groove and the pair of groove side faces, and in which the bottom portion space is in communication with the side face space.

Furthermore, it is preferable that the side face spaces have side-face width-extension concave portions which are respectively indented from the pair of groove side faces so as to widen the width between the pair of groove side faces in the retaining groove of the sealing member attachment portion, in which the sealing member attachment portion has a side-face concave-portion forming portion which forms the side-face width-extension concave portion, and a pair of side-face relative-projection portions which relatively project from a part of the side-face concave-portion forming portion that forms a bottom portion of the side-face width-extension concave portion due to the side-face width-extension concave portion being formed, in which the bottom portion space has a base portion concave portion which is indented from an outline of the base portion in the base portion, in which the base portion has a base-portion concave-portion forming portion which forms the base portion concave portion, and a base-portion relative-projection portion which relatively projects from a part of the base-portion concave-portion forming portion that forms a bottom portion of the base portion concave portion due to the base portion concave portion being formed, in which the base portion is inserted into the retaining groove in such a manner that a part of the base-portion concave-portion forming portion has a positional relationship of being arranged between a pair of the side-face concave-portion forming portions, and another parts other than the part of the base-portion concave-portion forming portion has a positional relationship of being arranged between the pair of side-face relative-projection portions in the retaining groove, or the base portion is inserted into the retaining groove in such a manner that the base-portion concave-portion forming portion has a positional relationship of being arranged between a part of the pair of side-face concave-portion forming portions, and the base-portion relative-projection portion has a positional relationship of being arranged between another part other than the part of the pair of side-face concave-portion forming portions in the retaining groove.

Furthermore, it is preferable that a groove opening portion of a part of the retaining groove at which the side-face width-extension concave portion is formed has an opening concave portion which is indented toward the groove bottom face so as to widen an opening of the retaining groove at the groove opening portion.

Furthermore, it is preferable that the lip portion has a rim-portion-abutting lip portion which abuts the opening rim portion and a facing-portion-abutting lip portion which abuts the rim portion facing portion when the container main body opening portion is closed by the lid body, and, the sealing member closes the container main body opening portion with the lid body in an airtight state, by way of abutting of the rim-portion-abutting lip portion to the opening rim portion and abutting of the facing-portion-abutting lip portion to the rim portion facing portion.

Furthermore, it is preferable that the retaining groove is formed so as to go around a rim part of the lid body, and the bottom portion space and the side face space are formed so as to go around the retaining groove along the rim part of the lid body.

Effects of the Invention

According to the present invention, it is possible to provide a substrate storing container for which cleaning solution does not easily remain in a retaining groove in a case of washing a lid body by cleaning solution with a sealing member being attached to a sealing member attachment portion.

BRIEF DESCRIPTION OF THE DRAWINGS

FIG. 3 is a perspective view illustrating a lid body 3 in a state in which a front retainer is removed in the substrate storing container 1 according to an embodiment of the present invention;

FIG. 4 is a back view illustrating the lid body 3 in a state in which a front retainer is removed in the substrate storing container 1 according to an embodiment of the present invention;

FIG. 5 is a cross sectional view along the line A-A in FIG. 4;

FIG. 6 is a cross sectional view along the line B-B in FIG. 4;

PREFERRED MODE FOR CARRYING OUT THE INVENTION

Figure 1:
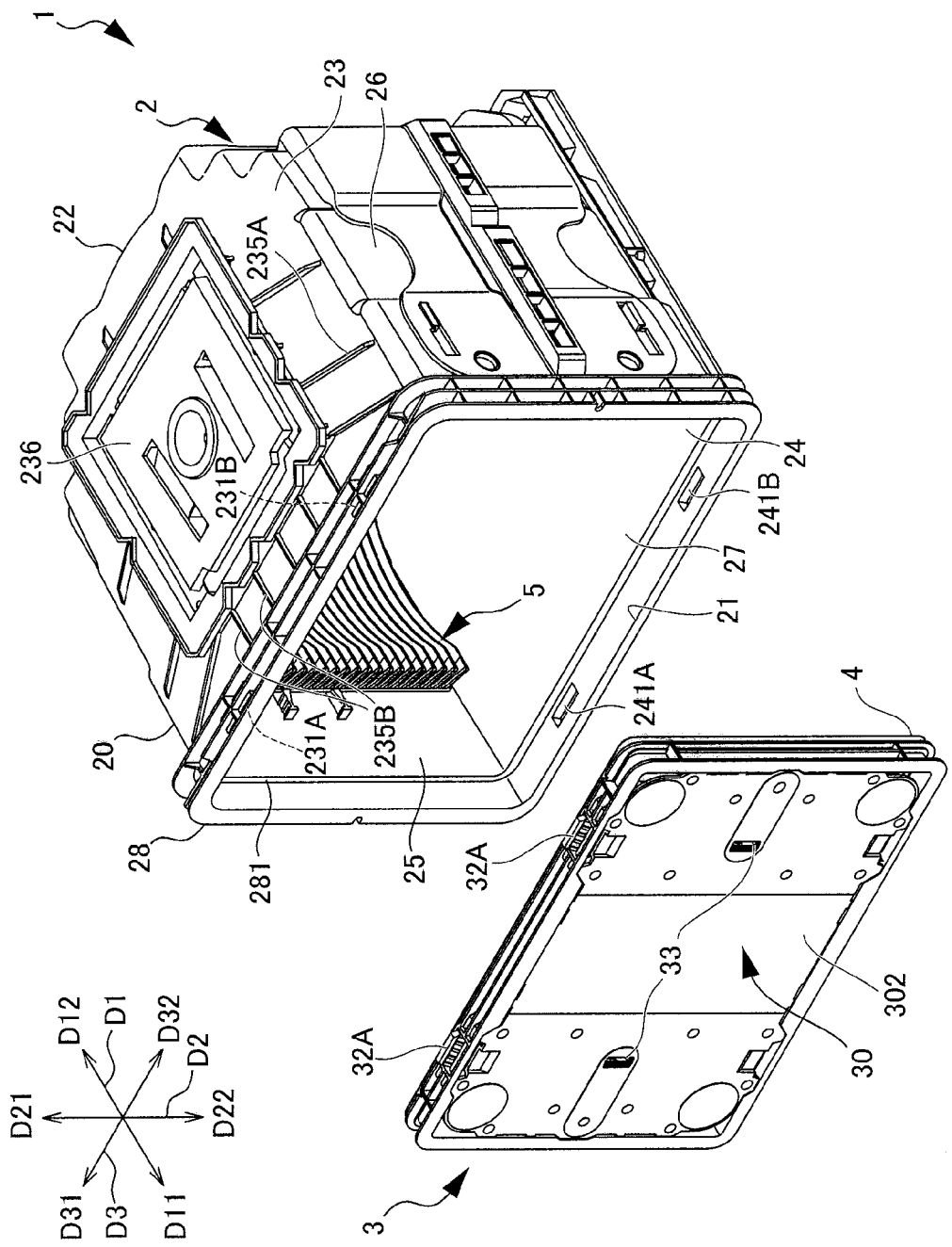
FIG. 1 is an exploded perspective view illustrating a substrate storing container 1 according to an embodiment of the present invention.
Figure 2:
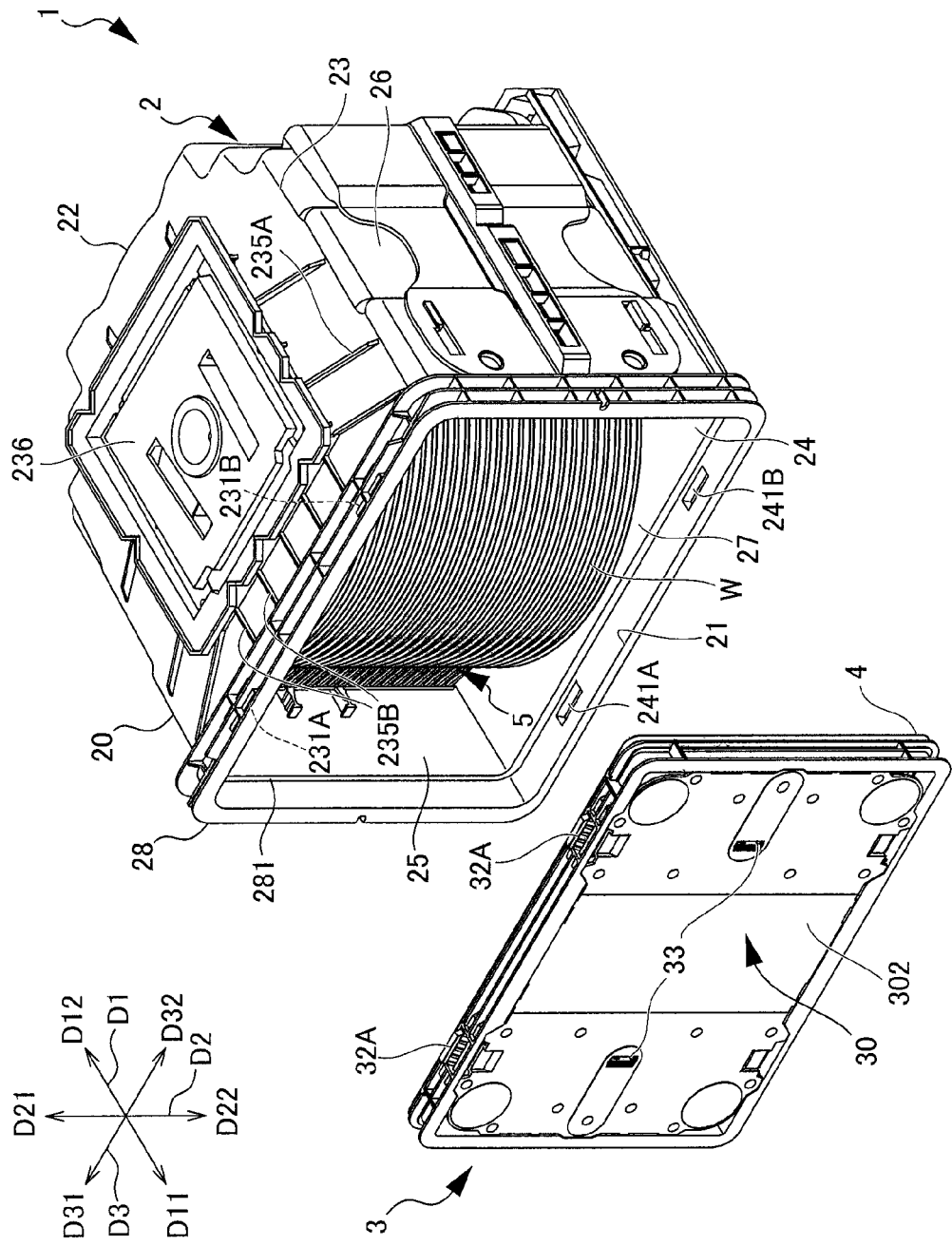
FIG. 2 is an exploded perspective view illustrating a state in which substrates W are stored in the substrate storing container 1 according to an embodiment of the present invention.

In the following, a substrate storing container 1 according to an embodiment of the present invention is described with reference to the drawings. FIG. 1 is an exploded perspective view illustrating the substrate storing container 1 according to an embodiment of the present invention. FIG. 2 is an exploded perspective view illustrating a state in which substrates W are stored in the substrate storing container 1 according to the embodiment of the present invention. FIG. 3 is a perspective view illustrating a lid body 3 of the substrate storing container 1 according to the embodiment of the present invention. FIG. 4 is a back view illustrating the lid body 3 of the substrate storing container 1 according to the embodiment of the present invention.

Figure 7:
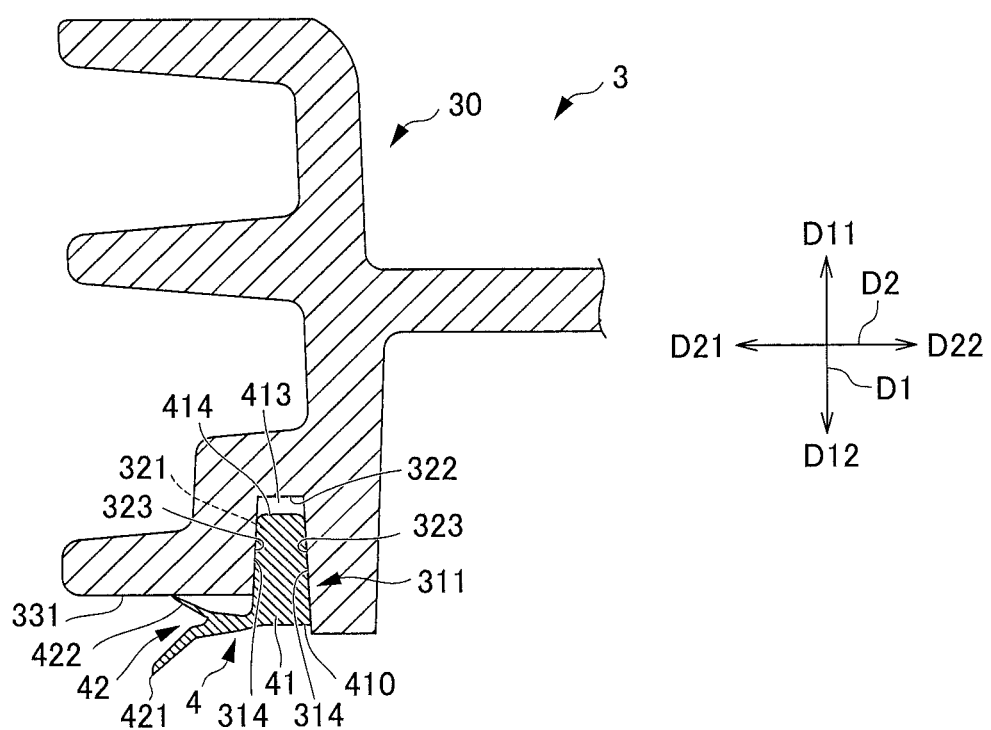
FIG. 7 is a cross sectional view along the line C-C in FIG. 4.
Figure 8:
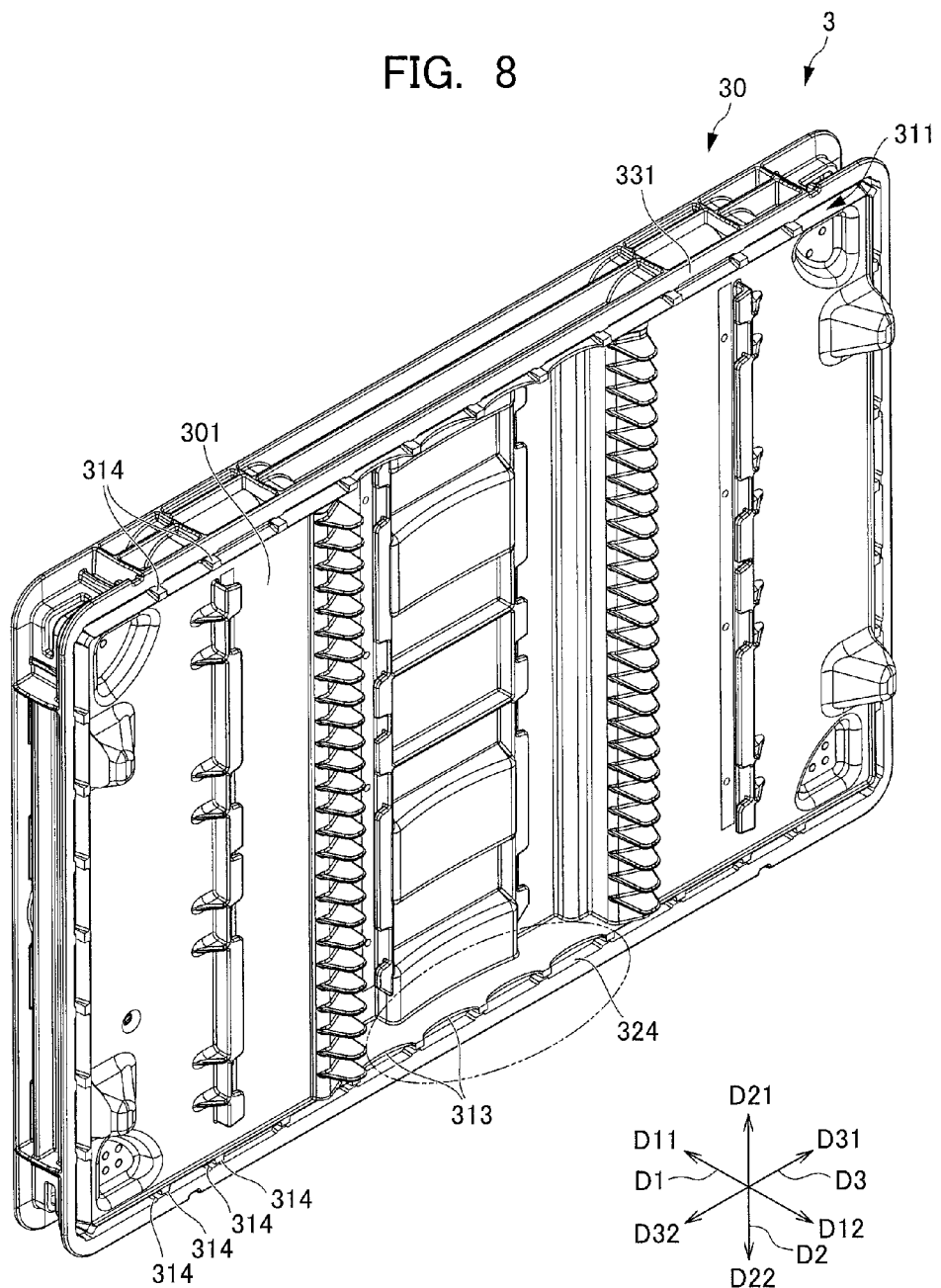
FIG. 8 is a perspective view illustrating a lid body main body 30 of the lid body 3 of the substrate storing container 1 according to an embodiment of the present invention.
Figure 9:
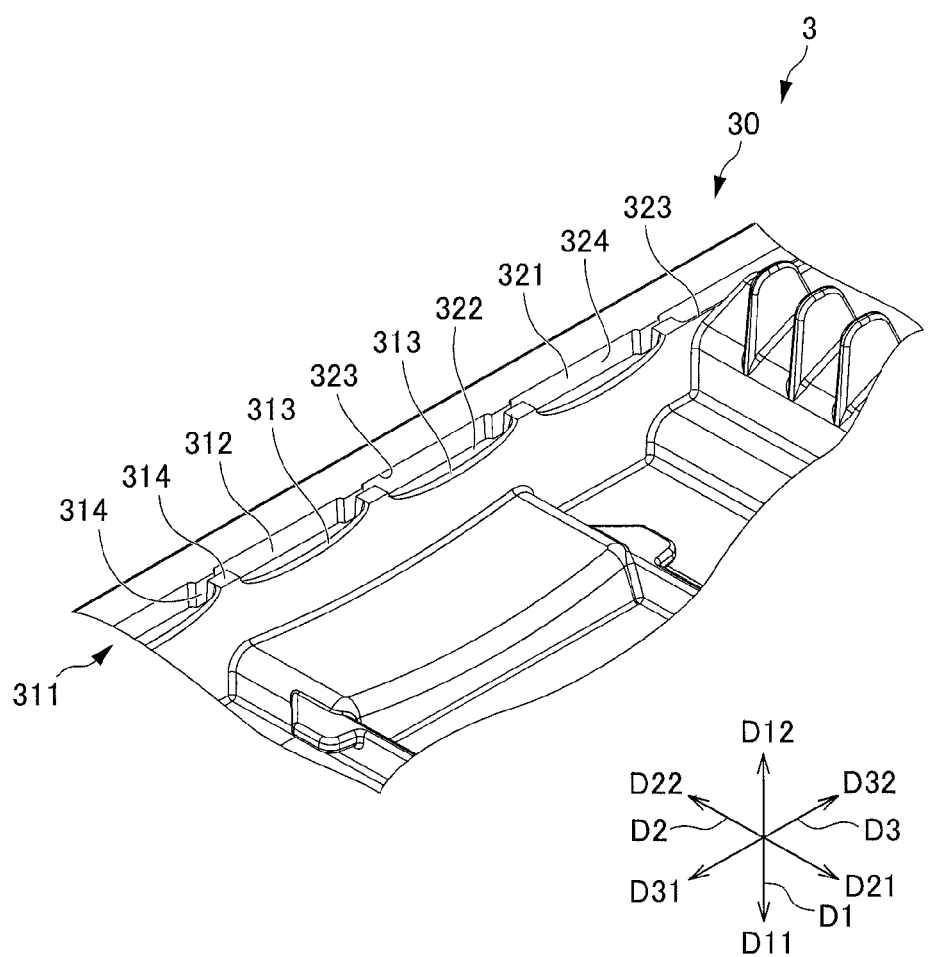
FIG. 9 is an enlarged perspective view illustrating a part surrounded by the two-dot dashed line shown in FIG. 8.
Figure 10:
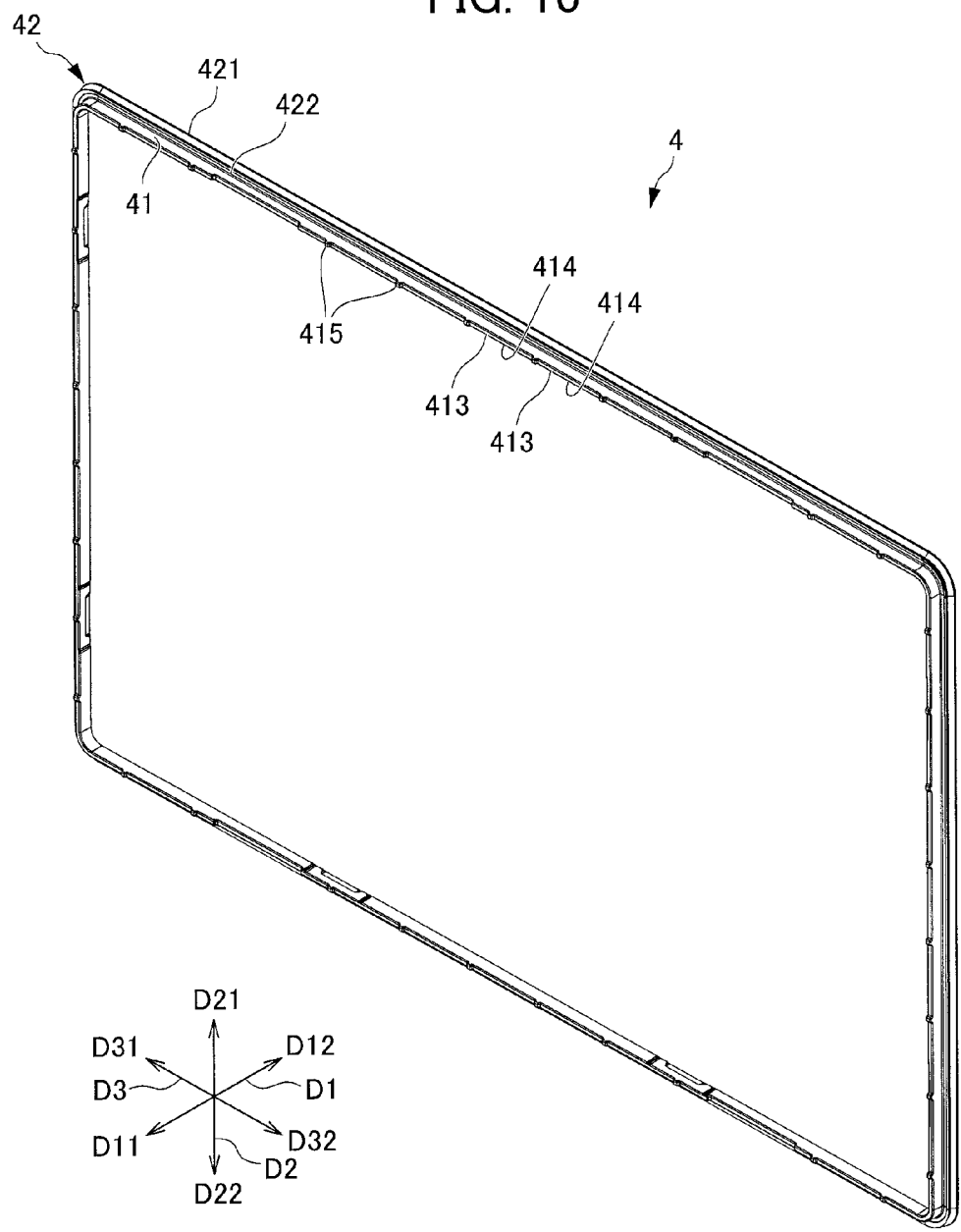
FIG. 10 is a perspective view illustrating a sealing member 4 of the lid body 3 of the substrate storing container 1 according to an embodiment of the present invention.
Figure 11:
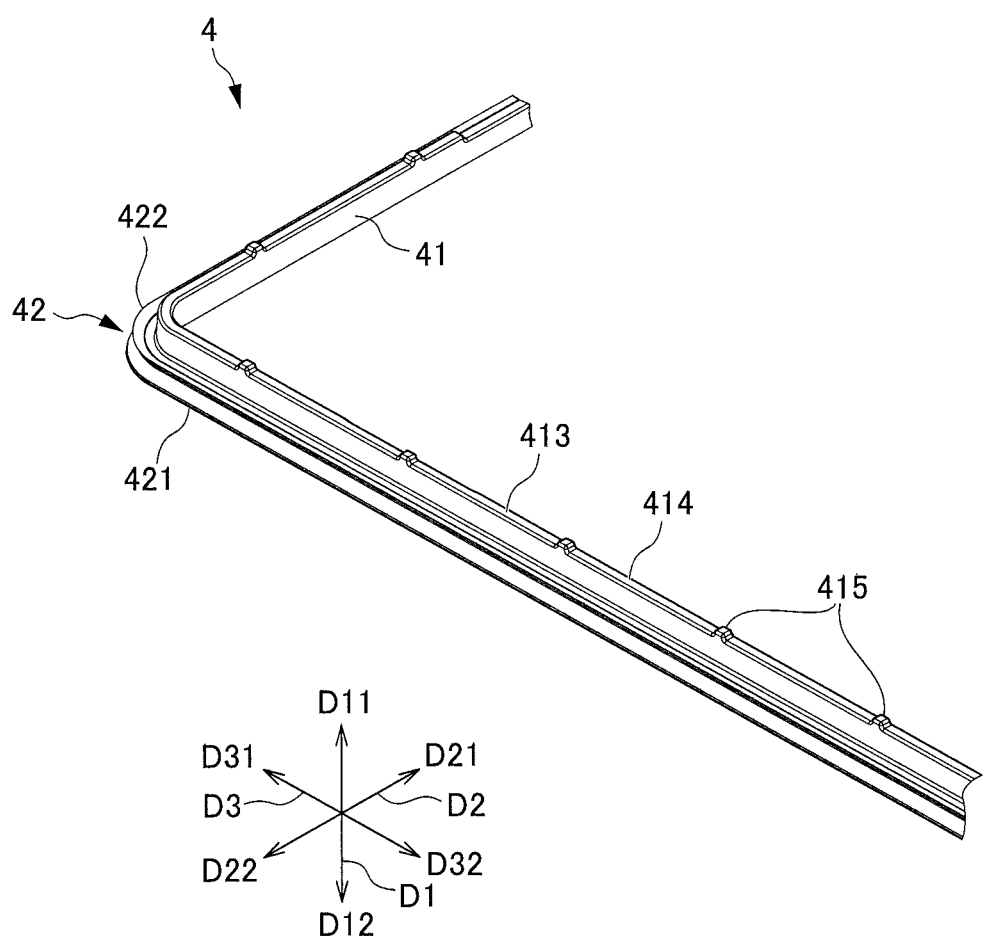
FIG. 11 is an enlarged perspective view illustrating the sealing member 4 of the lid body 3 of the substrate storing container 1 according to an embodiment of the present invention.

FIG. 5 is a cross sectional view along the line A-A in FIG. 4. FIG. 6 is a cross sectional view along the line B-B in FIG. 4. FIG. 7 is a cross sectional view along the line C-C in FIG. 4. FIG. 8 is a perspective view illustrating a lid body main body 30 of the lid body 3 of the substrate storing container 1 according to the embodiment of the present invention. FIG. 9 is an enlarged perspective view illustrating a vicinity of a part surrounded by a two-dot-dashed line shown in FIG. 8. FIG. 10 is a perspective view illustrating a sealing member 4 of the lid body 3 of the substrate storing container 1 according to the embodiment of the present invention. FIG. 11 is an enlarged perspective view illustrating the sealing member 4 of the lid body 3 of the substrate storing container 1 according to the embodiment of the present invention.

Herein, for convenience of explanation, the direction from a container main body 2 toward a lid body 3 (described later) (a direction from upper right to lower left in FIG. 1) is defined as a forward direction D11, and the direction opposite to the direction D11 is defined as a backward direction D12. Furthermore, these directions are defined as a forward/backward direction D1. In addition, the direction from a lower wall 24 to an upper wall 23 (described later) (upper direction in FIG. 1) is defined as an upper direction D21, and the direction opposite to the direction D21 is defined as a lower direction D22. Furthermore, these directions are defined as an upper/lower direction D2. Moreover, the direction from a second side wall 26 to a first side wall 25 (described later) (a direction from lower right to upper left in FIG. 1) is defined as a left direction D31, and the direction opposite to the direction D31 is defined as a right direction D32. Furthermore, these directions are defined as a left/right direction D3.

Furthermore, a substrate W (refer to FIG. 2) stored in a substrate storing container 1 is a disk-like silicon wafer, glass wafer, sapphire wafer, etc., and is a thin member used in industry. The substrate W of the present embodiment is a silicon wafer having a diameter of 300 mm to 450 mm.

As illustrated in FIGS. 1 and 2, the substrate storing container 1 is a container for storing the substrate W made of a silicon wafer as mentioned above, and includes the container main body 2, the lid body 3, a substrate support plate-like portion 5 as a lateral substrate support portion (not illustrated), a back side substrate support portion (not illustrated), and a front retainer as a lid body side substrate support portion (not illustrated).

As illustrated in FIG. 1, the container main body 2 has a tubular wall portion 20 with a container main body opening portion 21 formed at one end and the other end closed. A substrate storing space 27 is formed in the container main body 2. The substrate storing space 27 is formed to be surrounded by the wall portion 20. A substrate support plate-like portion 5 is disposed at a part of the wall portion 20 which forms the substrate storing space 27. A plurality of substrates W can be stored in the substrate storing space 27, as illustrated in FIG. 2.

The substrate support plate-like portion 5 is provided at the wall portion 20 so as to form a pair in the substrate storing space 27. When the container main body opening portion 21 is not closed by the lid body 3, the substrate support plate-like portion 5 can support the edge portions of the plurality of substrates W in a state in which adjacent substrates W are arranged in parallel to be spaced apart, by a predetermined interval by being abutted with the edge portions of the plurality of substrates W. The back side substrate support portion (not illustrated) is provided at the back side of the substrate support plate-like portion 5.

The back side substrate support portion (not illustrated) is provided at the wall portion 20 so as to form a pair with the front retainer (not illustrated) in the substrate storing space 27. When the container main body opening portion 21 is closed by the lid body 3, the back side substrate support portion (not illustrated) can support rear portions of the edge portions of the plurality of substrates W, by abutting with the edge portions of the plurality of substrates W.

The lid body 3 can be removably attached to an opening rim portion 28 (FIG. 1, etc.), which forms the container main body opening portion 21, and can close the container main body opening portion 21. The front retainer (not illustrated) is provided at a part of the lid body 3 which faces the substrate storing space 27 when the container main body opening portion 21 is closed by the lid body 3. The front retainer (not illustrated) is disposed so as to form a pair with the back side substrate support portion (not illustrated) inside the substrate storing space 27.

When the container main body opening portion 21 is closed by the lid body 3, the front retainer (not illustrated) can support front portions of the edge portions of the plurality of substrates W, by abutting with the edge portions of the plurality of substrates W. When the container main body opening portion 21 is closed by the lid body 3, the front retainer (not illustrated) retains the plurality of substrates W in a state in which adjacent substrates W are arranged in parallel to be spaced apart by a predetermined interval, by supporting the plurality of substrates W in cooperation with the back side substrate support portion (not illustrated). In the following, each portion will be described in detail.

As illustrated in FIG. 1, etc., the wall portion 20 of the container main body 2 includes a back wall 22, an upper wall 23, a lower wall 24, a first side wall 25, and a second side wall 26. The back wall 22, the upper wall 23, the lower wall 24, the first side wall 25, and the second side wall 26 are made of a plastic material, etc., and are configured so as to be integrally molded with polycarbonate in the present embodiment.

The first side wall 25 faces the second side wall 26, and the upper wall 23 faces the lower wall 24. A rear end of the upper wall 23, a rear end of the lower wall 24, a rear end of the first side wall 25, and a rear end of the second side wall 26 are all connected to the back wall 22. A front end of the upper wall 23, a front end of the lower wall 24, a front end of the first side wall 25, and a front end of the second side wall 26 have a positional relationship opposite the back wall 22, and configure an opening rim portion 28 which forms the container main body opening 21 in a substantially rectangular shape.

The opening rim portion 28 is provided at one end of the container main body 2, and the back wall 22 is located at the other end of the container main body 2. The profile of the container main body 2 formed by the outer faces of the wall portion 20 is a box shape. Inner faces of the wall portion 20, i.e. an inner face of the back wall 22, an inner face of the upper wall 23, an inner face of the lower wall 24, an inner face of the first side wall 25, and an inner face of the second side wall 26, form the substrate storing space 27, which is surrounded by these. The container main body opening portion 21 formed by the opening rim portion 28 is surrounded by the wall portion 20 and is in communication with the substrate storing space 27 formed inside the container main body 2. The substrate storing space 27 can store a maximum of twenty-five substrates W.

As illustrated in FIGS. 1 and 2, latch engagement concave portions 231A, 231B, 241A, and 241B, which are concave outwardly from the substrate storing space 27, are formed at portions of the upper wall 23 and the lower wall 24 which are proximal to the opening rim portion 28. Each of the latch engagement concave portions 231A, 231B, 241A, and 241B is respectively formed in the vicinities of both right and left ends of the upper wall 23 and the lower wall 24 in the total amount of four.

As illustrated in FIGS. 1 and 2, a flange fixing portion (not illustrated) and ribs 235A and 235B are provided so as to be integrally formed with the upper wall 23 at an outer face of the upper wall 23. The flange fixing portion (not illustrated) is disposed at the center portion of the upper wall 23. A top flange 236 is fixed at the flange fixing portion (not illustrated). The top flange 236 is disposed at the center portion of the upper wall 23. The top flange 236 is a member that is a portion which, upon suspending the substrate storing container 1 on, for example, an AMHS (Automated Material Handling System) and PGV (Person Guided Vehicle), is hung to be suspended at the substrate storing container 1.

Several ribs 235A extend respectively in the left-forward direction and the right-forward direction from the top flange 236. In addition, several ribs 235B extend in the forward direction D11 from the top flange 236 and extend in the backward direction D12 from the top flange 236.

As illustrated in FIG. 1, etc., the lid body 3 has a substantially rectangular shape which substantially corresponds to the shape of the opening rim portion 28 of the container main body 2. The lid body 3 is detachable relative to the opening rim portion 28 of the container main body 2, and the container main body opening portion 21 can be closed by the lid body 3, by the lid body 3 being attached to the opening rim portion 28. A ring-like sealing member 4 is attached to a face which is an inner face of the lid body 3 (a back side face of the lid body 3 illustrated in FIG. 1) and faces a face (a sealing face 281) of a part of the step difference formed at a location immediately in the backward direction D12 from an opening edge of the opening rim portion 28, when the lid body 3 closes the container main body opening portion 21.

When the lid body 3 is attached to the opening rim portion 28, a lip portion 42 of the sealing member 4 (described later) is elastically deformed by sandwiching between the sealing face 281 and a rim portion facing portion 331 which constitutes an inner face of the lid body 3, and the lid body 3 closes the container main body opening portion 21 in a sealed state. By the lid body 3 being removed from the opening rim portion 28, it becomes possible to load or unload the substrates W relative to the substrate storing space 27 in the container main body 2.

More specifically, the lid body 3 includes a lid body main body 30. The lid body main body 30 forms an outline of the lid body 3 in a substantially rectangular shape. For this reason, the lid body main body 30 has a substantially rectangular shape. The lid body main body 30 includes an inner face 301 (refer to FIG. 3, etc.) and an outer face 302. As described later, the inner face 301 faces the substrate storing space 27 when the container main body opening portion 21 is closed by the lid body 3. The outer face 302 is exposed to the outside of the substrate storing container 1 when the container main body opening portion 21 is closed by the lid body 3. The lid body main body 30 is made of a plastic material, etc., and is configured to be molded with polycarbonate in the present embodiment.

The portion which is a rim portion of the lid body main body 30 and faces the sealing face 281 constituting the opening rim portion 28 of the container main body 2 includes a sealing-member attachment portion 311 and a rim-portion facing portion 331, as illustrated in FIG. 5, etc. A retaining groove 321 is formed at the sealing-member attachment portion 311. The sealing member attachment portion 311 is formed to exist so as to go around the rim portion of the lid body main body 30, and the retaining groove 321 also exists so as to go around the rim portion of the lid body main body 30 along the sealing-member attachment portion 311. The rim-portion facing portion 331 is configured by a portion which is the rim portion of the lid body main body 30 facing the sealing face 281 constituting the opening rim portion 28, and which is a more outer portion of the lid body 3 than the retaining groove 321. The rim-portion facing portion 331 is configured by a portion which is the rim portion of the lid body main body 30 and which is a plate-like part parallel to the left/right direction D3 and the upper/lower direction D2.

The retaining groove 321 includes a groove bottom face 322 and a pair of groove side faces 323. As illustrated in FIG. 7, the cross sectional shape of the retaining groove 321 which is cut in a direction perpendicular to the direction in which the retaining groove 321 extends is rectangular. In the cross section, a face extending in the depth direction of the retaining groove 321 from the opening of the retaining groove 321 constitutes a pair of the groove side faces 323.

The groove bottom face 322 constitutes a bottom of the retaining groove 321. A base portion 41 (described later) of the sealing member 4 is inserted into the retaining groove 321. With such a configuration, the sealing member 4 is attached to the sealing-member attachment portion 311 of the lid body 3, and the lip portion 42 of the sealing member 4 can abut with the opening rim portion 28 and the rim portion facing portion 331.

Side face spaces, which are configured by side-face width-extension concave portions 324 that are spaces in communication with the openings of the retaining groove 321, respectively, are formed between a pair of the side faces 412 of the base portion 41 inserted into the retaining groove 321 and a pair of the groove side faces 323. The sealing-member attachment portion 311 includes a side-face concave-portion forming portion 312 which forms the side-face width-extension concave portion 324. The side-face width-extension concave portions 324 are formed so as to be respectively indented from the pair of the groove side faces 323 so as to widen the width between the pair of the groove side faces 323 in the retaining groove 321 of the sealing-member attachment portion 311. Therefore, since the side-face width-extension concave portions 324 are formed, as illustrated in FIG. 9, a portion of the pair of the groove side faces 323 of the retaining groove 321 has a shape that is shaved off in a substantially cuboid shape in a positional relationship facing each other.

As illustrated in FIGS. 3, 8 and 9, a groove opening portion, which is a central portion of the sealing member attachment portion 311 in the left/right direction D3 and which is a portion of the retaining groove 321 at which the side-face width-extension concave portion 324 is formed, includes an opening concave portion 313 that is a space. The opening concave portion 313 is formed at a portion of the side-face concave-portion forming portion 312 that forms the side-face width-extension concave portion 324, which is closer to the container main body 2. The opening concave portion 313 is configured by a concave portion which is indented toward the groove bottom face 322 so as to widen the opening of the retaining groove 321 at the groove opening portion in a substantially U-shape.

The sealing member attachment portion 311 includes a pair of side-face relative-projection portions 314. As described above, as illustrated in FIG. 9, since the side-face width-extension concave portion 324 is formed, a portion at which the side-face width-extension concave portion 324 is not formed relatively projects from the portion of the side-face concave-portion forming portion 312, which forms the bottom portion of the side face width extension concave portion 324. A pair of side-face relative-projection portions 314 which faces within the retaining groove 321 is configured with such projecting portions. The side-face relative-projection portions 314 project having a substantially cuboid shape. Pluralities of the side-face relative-projection portions 314 and side face space configured by the side-face width-extension concave portions 324 are alternately formed so as to go around the retaining groove 321 along the rim part of the lid body 3. The width of the retaining groove 321 at the portion at which the side face width extension concave portion 324 is formed is approximately 6 mm to 8 mm, and the width of the retaining groove 321 at the portions of the side face relative projection portions 314 is approximately 2 mm. The length of the side-face relative-projection portions 314 in the extending direction of the retaining groove 321 is approximately 3 mm. In addition, the indented amount of the opening concave portion 313 toward the groove bottom face 322 is approximately 3 mm. The adjacent side-face relative-projection portions 314 are arranged at an interval of 40 mm.

The sealing member 4 is made of various thermoplastic elastomers such as elastically deformable polyesters and polyolefins; fluorine containing rubber; silicone rubber; etc. As illustrated in FIG. 10, the sealing member 4 has a rectangular ring-like shape and is arranged so as to go around the outer rim portion of the lid body 3.

The sealing member 4 includes the base portion 41 and the lip portion 42. As illustrated in FIG. 5, etc., the cross sectional shape of the base portion 41 perpendicular to the ring-like circumferential direction of the sealing member 4 is rectangular. The base portion 41 includes a tip face 411, a pair of side faces 412 extending from the tip face 411, and a base end 410 located at the tip to which the side faces 412 extend. At the base portion 41, the tip face 411 and the pair of side faces 412 are inserted into the retaining groove 321. The pair of side faces 412 of the base portion 41 inserted into the retaining groove 321 and the pair of groove side faces 323 have a positional relationship of facing each other.

The lip portion 42 is provided so as to be integrally formed at the base end 410 located at the tip to which the side cases 412 extend from the tip face 411 of the base portion 41. The lip portion 42 extends from the base end 410 of the base portion 41 in a direction perpendicular to the extending direction of the side faces 412 from the top face 411 of the base portion 41, i.e. in the left direction in FIG. 5. As illustrated in FIG. 5, etc., the lip portion 42 branches into two in the middle so as to constitute a rim-portion-abutting lip portion 421 and a facing-portion-abutting lip portion 422. When the container main body opening portion 21 is closed by the lid body 3, the rim-portion-abutting lip portion 421 abuts the opening rim portion 28, and the facing-portion-abutting lip portion 422 abuts the rim-portion facing portion 331. Due to the rim-portion-abutting lip portion 421 abutting the opening rim portion 28 and the facing-portion-abutting lip portion 422 abutting the rim-portion facing portion 331, the lip portion 42 of the sealing member 4 intervenes between the opening rim portion 28 and the rim-portion facing portion 331, closely contacts the opening rim portion 28 and the rim-portion facing portion 331, and closes the container main body opening portion 21 with the lid body 3 in an airtight state.

A base portion concave portion 413 which constitutes a bottom portion space is formed in the base portion 41. As illustrated in FIG. 5, the base portion concave portion 413, which is a space, has a shape such that a portion of the tip face 411 of the base portion 41 is shaved off in a substantially cuboid shape, and exists between the base portion 41 inserted into the retaining groove 321 and the groove bottom face 322.

In other words, the bottom portion space includes the base portion concave portion 413 which is an indented space from the outline of the base portion 41 at the base portion 41. The portion of the base portion 41 which forms the base portion concave portion 413 constitutes a base-portion concave-portion forming portion 414. In addition, the base portion 41 includes a base-portion relative-projection portion 415. Due to the base portion concave portion 413 being formed in the base portion 41, the base-portion relative-projection portion 415 is configured by a portion which relatively projects from the portion of the base-portion concave-portion forming portion 414. Pluralities of the base-portion relative-projection portion 415 and the base portion concave portion 413 constituting the bottom portion space are alternately formed so as to go around the regaining groove 321 along the rim part of the lid body 3.

The thickness of the sealing member 4 in a direction connecting the pair of side faces 412 of the base portion 41 is approximately 2 mm. The projection amount of the base-portion relative-projection portion 415 is approximately 1.5 mm. As illustrated in FIG. 11, in a lateral view seen from a direction perpendicular to the extending direction of the sealing member 4, the base-portion relative-projection portion 415 has a substantially trapezoidal shape. The length of the base-portion relative-projection portion 415 in the extending direction of the sealing member 4 is approximately 3 mm at the tip portion of the base-portion relative-projection portion 415, and is approximately 5 mm at the base end portion of the base-portion relative-projection portion 415. The adjacent base portion relative projection portions 415 are arranged at an interval of 40 mm.

The base portion 41 is inserted into the retaining groove 321 in a positional relationship as below. As illustrated in FIG. 5, the base portion 41 is inserted into the retaining groove 321 in such a manner that a portion of the base-portion concave-portion forming portion 414 extending in the circumferential direction of the ring-like sealing member 4 has a positional relationship of being arranged between the pair of side-face concave-portion forming portions 312 at the retaining groove 321. With such a configuration, the bottom portion space having the portion of the base portion concave portion 413 illustrated in FIG. 5 is in communication with the side face space having a portion of the side-face width-extension concave portion 324 illustrated in FIG. 5.

In addition, as illustrated in FIG. 7, the base portion 41 is inserted into the retaining groove 321 in such a manner that the other portions other than the portion of the base-portion concave-portion forming portion 414 extending in the circumferential direction of the ring-like sealing member 4 has a positional relationship of being arranged between the pair of side face relative projection portions 314 in the retaining groove 321. With such a configuration, the bottom portion space having the portion of the base portion concave portion 413 illustrated in FIG. 7 is in communication with the side face space having the side-face width-extension concave portion 324 illustrated in FIG. 5.

In addition, as illustrated in FIG. 5, the base portion 41 is inserted into the retaining groove 321 in such a manner that the base-portion concave-portion forming portion 414 has a positional relationship of being arranged between portions of the pair of side-face concave-portion forming portions 312 extending in the circumferential direction of the ring-like sealing member 4 in the retaining groove 321. With such a configuration, as described above, the bottom portion space having the portion of the base portion concave portion 413 illustrated in FIG. 5 is in communication with the side face space having a portion of the side face width extension concave portion 324 illustrated in FIG. 5.

In addition, the base portion 41 is inserted into the retaining groove 321 in such a manner that the base-portion relative-projection portion 415 has a positional relationship of being arranged between other portions other than the portion of the pair of side-face concave-portion forming portion 312 extending in the circumferential direction of the ring-like sealing member 4 in the retaining groove 321. With such a configuration, as described above, the bottom portion space having a portion of the base portion concave portion 413 illustrated in FIG. 5 is in communication with the side face space having a portion of the side-face width-extension concave portion 324 illustrated in FIG. 6. The base portion 41 is inserted into the retaining groove 321 in such a positional relationship of repeating the order of the cross sectional portion illustrated in FIG. 5, the cross sectional portion illustrated in FIG. 6, the cross sectional portion illustrated in FIG. 5, the cross sectional portion illustrated in FIG. 7, the cross sectional portion Illustrated in FIG. 5, the cross sectional portion illustrated in FIG. 6 . . . in the direction in which the retaining groove 321 extends.

A latch mechanism is provided at the lid body 3. The latch mechanism is provided in the vicinity of both left and right ends of the lid body 3. As illustrated in FIG. 1, the latch mechanism includes two upper side latch portions 32A that can project from an upper side of the lid body 3 in the upper direction D21 and two lower latch portions (not illustrated) that can project from a lower side of the lid body 3 in the lower direction D22. The two upper latch portions 32A are arranged in the vicinity of both left and right ends of the upper side of the lid body 3, and the two lower latch portions are arranged in the vicinity of the left and right ends of the lower side of the lid body 3.

An operation portion 33 is provided at an outer face of the lid body 3. By operating the operation portion 33 from the front side of the lid body 3, it is possible to cause the upper side latch portions 32A and the lower side latch portions (not illustrated) to project from the upper side and the lower side of the lid body 3, as well as possible to make a state not projecting from the upper side and the lower side of the lid body 3. By the upper side latch portions 32A projecting from the upper side of the lid body 3 in the upper direction D21 to engage with the latch engagement concave portions 231A and 231B of the container main body 2, and the lower side latch portions (not illustrated) projecting from the lower side of the lid body 3 in the lower direction D22 to engage with the latch engagement concave portions 241A, 241B of the container main body 2, the lid body 3 is fixed to the opening rim portion 28 of the container main body 2.

A front retainer (not illustrated) is provided to be fixed inside of the lid body main body 30 of the lid body 3. The front retainer (not illustrated) includes a front retainer substrate receiving portion (not illustrated). Two of the front retainer substrate receiving portion (not illustrated) are arranged so as to form a pair separated by a predetermined interval in the left/right direction D3. The front retainer substrate receiving portions (not illustrated) arranged in twos by configuring to form pairs in this way are provided as twenty-five pairs in parallel in the upper/lower direction D2. By the substrates W being stored within the substrate storing space 27 and the lid body 3 closing, the front retainer substrate receiving portion (not illustrated) supports end edges of the edge portions of the substrates W by sandwiching therebetween.

In the substrate storing container 1 as described above, a flow of cleaning solution and air when washing the lid body 3 by cleaning solution are as follows. Initially, washing of the lid body 3 is performed by cleaning solution. At this moment, the Cleaning solution flows into the retaining groove 321 from the opening of the retaining groove 321. In particular, since the opening concave portion 313 of substantially U-shape is formed, much of the cleaning solution flows from this portion into the side face space, which is configured by the side face width extension concave portion 324. The cleaning solution that flows into the side-face width-extension concave portion 324 flows into the bottom portion space, which is configured by the base portion concave portion 413 that is in communication with the side-face width-extension concave portion 324. In this way, the cleaning solution flows in the side-face width-extension concave portion 324 and the base portion concave portion 413 which are in communication with each other, washes the retaining groove 321, and then discharges from the retaining groove 321 via the side-face width-extension concave portion 324.

After washing, air that is sprayed onto the lid body 3 flows in the retaining groove 321 from the opening of the retaining groove 321, similarly to the cleaning solution. In particular, since the opening concave portion 313 of substantially U-shape is formed, much of the air flows from this portion into the side face space configured by the side-face width-extension concave portion 324. The air having flowed into the side-face width-extension concave portion 324 then flows into the bottom portion space constituted by the base portion concave portion 413, which is in communication with the side-face width-extension concave portion 324. In this way, the air flows in the side-face width-extension concave portion 324 and the base portion concave portion 413 which are in communication with each other, blows off the cleaning solution remaining in the retaining groove 321, and discharges from the retaining groove 321 via the side-face width-extension concave portion 324. At this moment, even when the facing-portion-abutting lip portion 422 abuts the rim portion facing portion 331, the air having flowed into the side-face width-extension concave portion 324 located at the side opposite the lip portion 42 relative to the base portion 41 then flows in the side-face width-extension concave portion 324 located at the side of lip portion 42 relative to the base portion 41, via the base portion concave portion 413, as shown by the arrow in FIG. 5. Then, the air causes the facing-portion-abutting lip portion 422 to distance from the rim-portion facing portion 331, and discharges from the retaining groove 321 together with the remaining cleaning solution.

Then, tests were carried out in which the effect of the substrate storing container 1 according to the present embodiment was tested. In the tests, the substrate storing containers 1 according to the present embodiment were prepared as Present Invention Articles 1 to 3. In addition, lid bodies having a configuration identical to the Present Invention Articles other than the opening concave portion 313 not being formed therein were prepared as Present Invention Articles 4 to 6. In addition, a lid body in which a pair of the side-face width-extension concave portions 324 was not formed, but rather in which only one side-face width-extension concave portion 324 was formed, more specifically, only the side-face width-extension concave portion 324 at the inner side close to the center of the retaining groove 321 was formed, was prepared as Comparison Article 1, and lid bodies in which only the side-face width-extension concave portion 324 at an outer side close to the center of the retaining groove 321 was formed were prepared as Comparison Articles 2 to 4. In addition, a lid body in which the pair of side-face width-extension concave portions 324 was not formed was prepared as Comparison Article 5. In addition, a lid body in which the pair of side-face width-extension concave portion 324 was not formed, but rather only the side-face width-extension concave portion 324 at the inner side close to the center of the retaining groove 321 was formed, and the base portion concave portion 413 was not formed in the sealing member 4 was prepared as Comparison Article 6. Other than the differences in configuration as described above, Comparison Articles 1 to 6 have configurations identical to that of Present Invention Article 1. In addition, a conventional lid body in which the pair of side-face width-extension concave portion 324 and the base portion concave portion 413 were not formed was prepared as Comparison Article 7.

Then, in the tests, ultrapure water washing using ultrapure water as the cleaning solution was performed in the state of the sealing member 4 being attached to the lid body main body. Thereafter, drying was performed by blowing hot air. This step was performed in a plurality of sets, with three times being one set, for all of Present Invention Articles and Comparison Articles, and results relating to residual conditions of the cleaning solution in the retaining groove were obtained. The temperature of the hot air was approximately 75° C. to 80° C., and the period of drying by blowing hot air was approximately 20 minutes. Blowing hot air was performed toward the center of the long side of the lid body main body having a rectangular shape. The results are as shown in Table 1 and Table 2. ○ (circle) indicates that the cleaning solution did not remain in the retaining groove for every time performing the test. ○ (circle) or Δ (triangle) indicates that the cleaning solution slightly remained in the retaining groove only once among the three times in one set only in a few sets among the tests performed for several sets, and indicates that the cleaning solution did not remain in the retaining groove for the other sets. Δ (triangle) indicates that the cleaning solution slightly remained in the retaining groove one time among three times performing the test, and the cleaning solution did not remain in the other two times, for all of the sets. x (cross symbol) indicates that an abundance of the cleaning solution remained in the retaining groove for every time performing the test.

TABLE 1

| | PRESENT INVENTION ARTICLE 1 | PRESENT INVENTION ARTICLE 2 | PRESENT INVENTION ARTICLE 3 | PRESENT INVENTION ARTICLE 4 | PRESENT INVENTION ARTICLE 5 | PRESENT INVENTION ARTICLE 6 |
|---|---|---|---|---|---|---|
| RESULT | ○ | ○ | ○ | ○ | ○ | ○ or Δ |

TABLE 2

| | COMPARISON ARTICLE 1 | COMPARISON ARTICLE 2 | COMPARISON ARTICLE 3 | COMPARISON ARTICLE 4 | COMPARISON ARTICLE 5 | COMPARISON ARTICLE 6 | COMPARISON ARTICLE 7 |
|---|---|---|---|---|---|---|---|
| RESULT | X | Δ | X | X | Δ | X | X |

As shown in Table 1, the results were preferable for all of Present Invention Articles 1 to 6. In other words, for Present Invention Articles 1 to 5, the cleaning solution did not remain in the retaining groove 321. For Present Invention Article 6, the cleaning solution did not remain in the retaining groove 321 for most of the times performing the abovementioned washing and drying repeatedly for several sets. The cleaning solution slightly remained in the retaining groove 321 only once in each few sets. On the other hand, as shown in Table 2, a small amount of the cleaning solution partly remained in the retaining groove even for Comparison Article 2 and Comparison Article 5, which were considered to have the best result. An abundance of the cleaning solution remained for the other Comparison Articles 1, 3, 4, 6, and 7.

From this result, it is found that all of the Present Invention Articles obtained preferable results. In particular, it is found that a preferable result can be obtained more reliably due to the pair of side-face width-extension concave portion 324 or the base portion concave portion 413 being formed, and furthermore, the opening concave portion 313 being formed. On the other hand, it is also found that a preferable result cannot be obtained in a case of the lid body in which the pair of side-face width-extension concave portions 324 or the base portion concave portion 413 is not formed. For example, it is found that a preferable result can be obtained when the pair of side-face width-extension concave portions 324 is formed, but a preferable result cannot be obtained when only one side-face width-extension concave portion 324 is formed. Similarly, it is found that a preferable result cannot be obtained in a case in which only the base portion concave portion 413 is formed without forming the pair of side-face width-extension concave portions 324.

According to the substrate storing container 1 according to the embodiment with the abovementioned configuration, it is possible to obtain the following effects.

The substrate storing container includes: a container main body 2 having a substrate storing space 27 that can store a plurality of substrates W formed inside thereof, and having, at one end portion thereof, an opening rim portion 28 at which a container main body opening portion 21 that is in communication with the substrate storing space 27 is formed; a lid body 3 that is removably attached to the container main body opening portion 21, has a sealing member attachment portion 311 and a rim portion facing portion 331 that faces the opening rim portion 28, and can close the container main body opening portion 21; and a sealing member 4 that is attached to the sealing member attachment portion 311 of the lid body, can abut the opening rim portion 28 and the rim portion facing portion 331, and, by interposing between the opening rim portion 28 and the rim portion facing portion 331 to abut and closely contact the opening rim portion 28 and the rim portion facing portion 331, closes the container main body opening portion 21 together with the lid body 3 in an airtight state.

The sealing member attachment portion 311 has a retaining groove 321 that has a groove bottom face 322 and a pair of groove side faces 323. The sealing member 4 has a base portion 41 and a lip portion 42, the base portion 41 having a tip face 411 and a pair of side faces 412 extending from the tip face 411, in which the tip face 411 and the pair of the side faces 412 are inserted into the retaining groove 321, and the lip portion 42 extending from the base portion 41 and abutting the opening rim portion 28 and the rim portion facing portion 331. The tip face 411 of the base portion 41 inserted into the retaining groove 321 and the groove bottom face 322 have a positional relationship of facing each other, and a bottom portion space is formed between the base portion 41 inserted into the retaining groove 321 and the groove bottom face 322. Furthermore, a pair of side faces 412 of the base portion 41 inserted into the retaining groove 321 and the pair of groove side faces 323 have a positional relationship of facing each other, and side face spaces which are in communication with an opening of the retaining groove 321 are respectively formed between the pair of side faces 412 of the base portion 41 inserted into the retaining groove 321 and the pair of groove side faces 323. Then, the bottom portion space is in communication with the side face space.

With such a configuration, it is possible to flow the air into the retaining groove 321 via the side face space, in the case of washing in the state in which the sealing member 4 is attached to the lid body main body 30, and cleaning solution remaining in the retaining groove 321. Furthermore, since the bottom portion space is in communication with the side face space, it is possible to flow the air which had flowed through one side face space into the bottom portion space. Then, it is possible to easily discharge the air having flowed in the bottom portion space via the other side face space to the outside of the retaining groove 321 together with the cleaning solution remaining in the retaining groove 321.

Furthermore, the side face space has the side-face width-extension concave portions 324 which are respectively indented from the pair of the groove side faces 323 so as to widen the width between the pair of the groove side faces 323 in the retaining groove 321 of the sealing member attachment portion 311. The sealing member attachment portion 311 has the side-face concave-portion forming portion 312 which forms the side-face width-extension concave portion 324 and a pair of the side-face relative-projection portions 314 which relatively projects from a portion of the side-face concave-portion forming portions 312 that form a bottom portion of the side-face width-extension concave portion 324 due to the side-face width-extension concave portion 324 being formed. The bottom portion space has a base portion concave portion 413 which is indented from an outline of the base portion 41 in the base portion 41. The base portion 41 has the base-portion concave-portion forming portion 414 which forms the base portion concave portion 413, and the base-portion relative-projection portion 415 which relatively projects from a portion of the base-portion concave-portion forming portion 414 which forms a bottom portion of the base portion concave portion 413 due to the base portion concave portion 413 being formed.

Then, the base portion 41 is inserted into the retaining groove 321 in such a manner that a part of the base-portion concave-portion forming portion 414 has a positional relationship of being arranged between a pair of the side-face concave-portion forming portions 312, and another parts other than the part of the base-portion concave-portion forming portion 414 has a positional relationship of being arranged between the pair of side-face relative-projection portions 314 in the retaining groove 321, or the base portion 41 is inserted into the retaining groove 321 in such a manner that the base-portion concave-portion forming portion 414 has a positional relationship of being arranged between a part of the pair of side-face concave-portion forming portions 312, and the base-portion relative-projection portion 415 has a positional relationship of being arranged between another part other than the part of the pair of side-face concave-portion forming portions 312 in the retaining groove 321.

With such a configuration, it is possible to easily discharge the cleaning solution remaining in the retaining groove 321 from the side-face width-extension concave portion 324 via the base portion concave portion 413 which constitutes a bottom portion space that is formed in the sealing member 4, and the side-face width-extension concave portion 324 which is formed in the sealing member attachment portion 311 and constitutes a side face space.

Furthermore, a groove opening portion of a part of the retaining groove 321 at which the side-face width-extension concave portion 324 is formed has the opening concave portion 313 which is indented toward the groove bottom face 322 so as to widen an opening of the retaining groove 321 at the groove opening portion.

With such a configuration, it is possible to cause air to easily flow in the side-face width-extension concave portion 324 through the opening concave portion 313, and it is possible to discharge the cleaning solution remaining in the retaining groove 321 from the retaining groove 321 with much more air.

Furthermore, the lip portion 42 has the rim-portion-abutting lip portion 421 which abuts the opening rim portion 28 and the facing-portion-abutting lip portion 422 which abuts the rim portion facing portion 331, when the container main body opening portion 21 is closed by the lid body 3. Due to the rim-portion-abutting lip portion 421 abutting the opening rim portion 28 and the facing-portion-abutting lip portion 422 abutting the rim portion facing portion 331, the sealing member 4 closes the container main body opening portion 21 together with the lid body 3 in an airtight state.

With such a configuration, it is possible to seal between the container main body opening portion 21 and the lid body 3 by the rim-portion-abutting lip portion 421 and the facing-portion-abutting lip portion 422, even in a case in which it is not possible to ensure the sealing at the retaining groove 321 by the base portion 41 due to the existence of the bottom portion space.

Furthermore, the retaining groove 321 is formed so as to go around a rim part of the lid body 3, and the bottom portion space and the side face space are formed so as to go around the retaining groove 321 along the rim part of the lid body 3. With such a configuration, regardless of the position in the retaining groove 321 at which the cleaning solution may remain, it is possible to discharge the remaining cleaning solution to the outside of the retaining groove 321 by air which has flowed in from either of the side face spaces.

The present invention is not limited to the abovementioned embodiments, and modifications thereto within the technical scope claimed in the claims are possible.

For example, although the bottom portion space is configured by the base portion concave portion 413, and the side face space is configured by the side face width extension concave portion 324, the present invention is not limited to these configurations. For example, it may be configured by a concave portion which is formed by the groove bottom face 322 of the retaining groove 321 being indented, without forming the base portion concave portion 413 at the base portion 41 of the sealing member 4. In addition, for example, the side face space may be configured by a side face concave portion which is formed by the pair of side faces 412 of the base portion 41 of the sealing member 4 being indented.

Furthermore, although the base portion 41 is inserted into the retaining groove 321 in such a positional relationship of repeating the order of the cross sectional portion illustrated in FIG. 5, the cross sectional portion illustrated in FIG. 6, the cross sectional portion illustrated in FIG. 5, the cross sectional portion illustrated in FIG. 7, the cross sectional portion illustrated in FIG. 5, the cross sectional portion illustrated in FIG. 6 . . . in the direction in which the retaining groove 321 extends in the present embodiment, the present invention is not limited thereto. It is acceptable so long as the base portion 41 is inserted into the retaining groove 321 in such a manner that the cross sectional portion illustrated in FIG. 5, the cross sectional portion illustrated in FIG. 6, and the cross sectional portion illustrated in FIG. 7 are positioned alternately in the direction in which the retaining groove 321 extends.

Furthermore, although the bottom portion space and the side face space are formed so as to go around the retaining groove 321 along the rim part of the lid body 3, the present invention is not limited thereto. In addition, although ultra-pure water is used as the cleaning solution for the lid body 3, the present invention is not limited thereto. Furthermore, the shapes of the container main body 2 and the lid body 3, the number of substrates W which can be stored in the container main body 2, and dimensions thereof are not limited to the shapes of the container main body 2 and the lid body 3, the number of substrates W that can be stored in the container main body 2, and the dimensions thereof according to the present embodiment.

EXPLANATION OF REFERENCE NUMERALS 1 substrate storing container
2 container main body
3 lid body
4 sealing member
20 wall portion
21 container main body opening portion
27 substrate storing space
28 opening rim portion
30 lid body main body
41 base portion
42 lip portion
311 sealing member attachment portion
312 side-face concave-portion forming portion
313 opening concave portion
314 side-face relative-projection portion
321 retaining groove
322 groove bottom face
323 groove side face
324 side-face width-extension concave portion
331 rim portion facing portion
411 tip face
412 side face
413 base portion concave portion
414 base-portion concave-portion forming portion
415 base-portion relative-projection portion
421 rim-portion-abutting lip portion
422 facing-portion-abutting lip portion
W substrate

The invention claimed is:

1. A substrate storing container comprising:
a container main body having a substrate storing space that configured to store a plurality of substrates formed inside thereof, and having, at one end portion thereof, an opening rim portion at which a container main body opening portion that is in communication with the substrate storing space is formed;
a lid body that is removably attached to the container main body opening portion, has a sealing member attachment portion and a rim portion facing portion that faces the opening rim portion, and can close the container main body opening portion; and
a sealing member that is attached to the sealing member attachment portion of the lid body, can abut the opening rim portion and the rim portion facing portion, and, by interposing between the opening rim portion and the rim portion facing portion to abut and closely contact the opening rim portion and the rim portion facing portion, closes the container main body opening portion together with the lid body in an airtight state,
wherein the sealing member attachment portion has a retaining groove that has a groove bottom face and a pair of groove side faces,
wherein the sealing member has a base portion and a lip portion, the base portion having a tip face and a pair of side faces extending from the tip face, wherein the tip face and the pair of the side faces are inserted into the retaining groove, and the lip portion extending from the base portion and abutting the opening rim portion and the rim portion facing portion,
wherein the tip face of the base portion inserted into the retaining groove and the groove bottom face have a positional relationship of facing each other, and a bottom portion space is formed between the base portion inserted into the retaining groove and the groove bottom face,
wherein a pair of side faces of the base portion inserted into the retaining groove and the pair of groove side faces have a positional relationship of facing each other, and side face spaces which are in communication with an opening of the retaining groove are respectively formed between the pair of side faces of the base portion inserted into the retaining groove and the pair of groove side faces,
wherein the bottom portion space is in communication with the side face space,
wherein the side face spaces have side-face width-extension concave portions which are respectively indented from the pair of groove side faces so as to widen the width between the pair of groove side faces in the retaining groove of the sealing member attachment portion,
wherein the sealing member attachment portion has a side-face concave-portion forming portion which forms the side-face width-extension concave portion, and a pair of side-face relative-projection portions which relatively project from a part of the side-face concave-portion forming portion that forms a bottom portion of the side-face width-extension concave portion due to the side-face width-extension concave portion being formed,
wherein the bottom portion space has a base portion concave portion which is indented from an outline of the base portion in the base portion,
wherein the base portion has a base-portion concave-portion forming portion which forms the base portion concave portion, and a base-portion relative-projection portion which relatively projects from a part of the base-portion concave-portion forming portion that forms a bottom portion of the base portion concave portion due to the base portion concave portion being formed, and
wherein the base portion is inserted into the retaining groove in such a manner that a part of the base-portion concave-portion forming portion has a positional relationship of being arranged between a pair of the side-face concave-portion forming portions, and another parts other than the part of the base-portion concave-portion forming portion has a positional relationship of being arranged between the pair of side-face relative-projection portions in the retaining groove, or the base portion is inserted into the retaining groove in such a manner that the base-portion concave-portion forming portion has a positional relationship of being arranged between a part of the pair of side-face concave-portion forming portions, and the base-portion relative-projection portion has a positional relationship of being arranged between another part other than the part of the pair of side-face concave-portion forming portions in the retaining groove.

2. The substrate storing container according to claim 1, wherein a groove opening portion of a part of the retaining groove at which the side-face width-extension concave portion is formed has an opening concave portion which is indented toward the groove bottom face so as to widen an opening of the retaining groove at the groove opening portion.

3. The substrate storing container according to claim 1, wherein the lip portion has a rim-portion-abutting lip portion which abuts the opening rim portion and a facing-portion-abutting lip portion which abuts the rim portion facing portion when the container main body opening portion is closed by the lid body, and, the sealing member closes the container main body opening portion with the lid body in an airtight state, by way of abutting of the rim-portion-abutting lip portion to the opening rim portion and abutting of the facing-portion-abutting lip portion to the rim portion facing portion.

4. The substrate storing container according to claim 1, wherein the retaining groove is formed so as to go around a rim part of the lid body, and
    wherein the bottom portion space and the side face space are formed so as to go around the retaining groove along the rim part of the lid body.

* * * * *